United States Patent
Harder

(10) Patent No.: US 7,312,610 B2
(45) Date of Patent: Dec. 25, 2007

(54) METHOD FOR ACQUIRING MAGNETIC RESONANCE DATA FROM A LARGE EXAMINATION REGION

(75) Inventor: Martin Harder, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/142,118

(22) Filed: Jun. 1, 2005

(65) Prior Publication Data

US 2005/0264286 A1    Dec. 1, 2005

(30) Foreign Application Priority Data

Jun. 1, 2004   (DE) ...................... 10 2004 026 616

(51) Int. Cl.
*G01V 3/00* (2006.01)
(52) U.S. Cl. ..................................... 324/307
(58) Field of Classification Search ........ 324/300–322; 600/410–435
See application file for complete search history.

(56) References Cited

U.S. PATENT DOCUMENTS

| | | | |
|---|---|---|---|
| 5,423,315 A | 6/1995 | Margosian | |
| 6,479,996 B1 | 11/2002 | Hoogeveen et al. | |
| 6,586,934 B2 * | 7/2003 | Biglieri et al. | 324/309 |
| 6,597,173 B1 * | 7/2003 | Bernstein | 324/318 |
| 6,882,149 B2 | 4/2005 | Nitz | |
| 6,956,373 B1 * | 10/2005 | Brown et al. | 324/309 |
| 2002/0011844 A1 | 1/2002 | Biglieri et al. | |
| 2004/0210129 A1 * | 10/2004 | Riederer et al. | 600/415 |
| 2005/0065421 A1 * | 3/2005 | Burckhardt | 600/407 |

FOREIGN PATENT DOCUMENTS

| | | |
|---|---|---|
| EP | 0 318 176 | 2/1996 |
| WO | WO 02/10787 | 2/2002 |

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

In a method for magnetic resonance data acquisition from an examination region, that is larger than a maximum acquisition region of the magnetic resonance apparatus, a planning data set is generated and that is used to establish the examination region and the examination region is automatically separated into a number of acquisition regions by a computer. Each of the acquisition regions is limited in terms of its dimensions by the maximum acquisition region. A measurement protocol is created that includes parameters that are applicable for all acquisition regions and parameters applicable specifically for only one acquisition region. The acquisition regions are automatically positioned in series within the maximum acquisition volume with the measurement protocol in order to generate a measurement data set for each acquisition region. The measurement data sets are subsequently combined.

8 Claims, 5 Drawing Sheets

METHOD FOR ACQUIRING MAGNETIC RESONANCE DATA FROM A LARGE EXAMINATION REGION

BACKGROUND OF THE INVENTION

1. Field of the Invention

The present invention concerns a method for acquiring data from an examination region with a magnetic resonance apparatus, the examination region being larger than a maximum data acquisition region of the magnetic resonance apparatus.

2. Description of the Prior Art

Magnetic resonance (MR) technology enables non-invasive medical imaging of a subject. A region of a patient to be examined in a basic magnetic field is exposed to radio-frequency magnetic energy (RF field) for excitation of an emission of MR signals. For spatially resolved imaging, the MR signals are detected, and spatial coding is achieved using spatially varying gradient fields. A sequence of gradient fields and RF fields for data acquisition is designated as a measurement sequence. The quality of an MR exposure depends on, among other things, the homogeneity of the basic magnetic field. This is typically generated with a superconducting basic field magnet and, together with requirements of the gradient and RF field, determines a usable maximum data acquisition region of the MR apparatus. This is typically in the range of a few decimeters. The requirements for the magnetic and RF fields, for example with regard to spatial and temporal resolution, depend on the respective measurement sequence to be implemented, such that the maximum data acquisition region can be varied in its dimensions depending on the measurement sequence, i.e. depending on the intended imaging.

Acquiring data from an examination region that is larger than the available maximal acquisition region of the magnetic resonance apparatus is problematical. This problem is particularly serious in MR apparatuses with a so-called short bore, i.e. with a short basic field magnet. Examples of problematic examinations are whole-body examinations, examinations of the spinal column along its entire length, peripheral angiography examinations and precautionary screening examinations with regard to metastases.

The advantages of a short basic field magnet, namely allowing better access to the patient for interventional procedures and improving patient comfort by alleviating claustrophobic feelings, are offset by the small homogeneity volume of the associated basic magnetic field. It is a goal in MR technology to generate optimally large, homogeneously exposed MR images in an optimally short examination time. The handling of the magnetic resonance apparatus should be simpler rather than more complicated from the viewpoint of the user.

Two approaches are pursued for acquisition of body regions exceeding the maximum data acquisition region of the MR apparatus: namely "Step-by-Step&Compose" technique and the "Move-during-Scan" technique.

In the "Step-by-Step&Compose" technique, a user separates the examination region into a number of sub-regions that are individually optimally measured isocentrically, i.e. centrally in the maximal acquisition region by movement of the patient bed through successive stationary bed positions. A completed data set for an MR image is obtained in each measurement. The various MR exposures are merged in a subsequent post-processing step. A difficulty of this technique is that numerous measurement parameters of the various partial measurements must be perfectly matched to one another by the user. This involves, for example:

the spatial position and size of the acquisition regions of the various, possibly partially overlapping, partial measurements, the optimal temporal matching of the table shifting steps, for example for contrast agent angiography, the selection of the respective coils to be used, the accounting for the homogeneity and linearity of basic magnetic, gradient magnetic and RF fields for homogeneous exposure of the MR acquisitions and to reduce distortions.

The user must account for many dependencies in planning and post-processing of such an examination. This requires a large time expenditure as well as significant expertise.

In the "Move-during-Scan" technique, a three-dimensional image data set is generated while a patient is continuously moved through the MR apparatus. The speed of the table and the frequency of the line-by-line excitation and scanning of the MR signals are thereby matched to one another such that the necessary spatial resolution results along each axis. This technique is still in its infancy and exhibits the disadvantage of being limited with regard to the imaging methods (i.e. measurement sequences) for which it can be used.

Neither known technique is a satisfactory solution for the problem described above with regard to the measurement preparation time, the operating comfort and measurement result.

SUMMARY OF THE INVENTION

An object of the present invention is to simplify and to accelerate, in terms of workflow, data acquisition from an examination region that is larger than an available maximum data acquisition region of a magnetic resonance apparatus.

This object is achieved in accordance with the invention by a method for data acquisition from an examination region with a magnetic resonance apparatus, wherein the examination region is larger than a maximum acquisition region of the magnetic resonance apparatus, including generating a planning data set and establishing the examination region using the planning data set, automatically separating the examination region into a number of acquisition regions with a computer of the magnetic resonance apparatus, with the maximum acquisition region being an upper limit for the dimensions of the acquisition regions, creating a measurement protocol that includes a first group of measurement protocol parameters that are applicable for all acquisition regions and a second group of measurement parameters that are applicable specifically for only one acquisition region, automatically positioning the acquisition regions in series within the maximum acquisition volume using the measurement protocol in order to generate respective measurement data sets for the acquisition regions, and combining the measurement data sets into an overall measurement data set of the examination region with the computer and using measurement parameters of the measurement protocol.

As used herein the data acquisition region means the region to be examined, for example of a patient. Maximum acquisition region means the (as previously described) data acquisition region of the MR apparatus in which the requirements of the measurement sequence to be used are fulfilled for the basic magnetic field, the gradient magnetic field and the RF field. Each of the acquisition regions is smaller than or equal in size to this maximum acquisition region, such that the necessary requirements are satisfied for each acquisition region.

The planning data set can be generated, for example, using a whole-body test measurement which, for example, is implemented as a type of the previously-described "Step-by-Step&Compose" technique or the "Move-during-Scan" technique. The planning data set is shown to the user, for example on an operating unit of the MR apparatus. The user plans the examination independently of the geometry of the currently available MR apparatus, i.e. independent of the length of the basic field magnet, its maximal acquisition volume, etc. For this purpose, among other things, the user establishes the examination region and the measurement sequence to be implemented, i.e. the user creates a measurement task for a specific imaging.

A measurement protocol with the necessary measurement parameters is typically created for every such measurement task. This measurement task can now be wholly-automatically processed with the invention, by the examination region being divided into acquisition regions. Specific measurement parameters that can be automatically determined based on the separation are calculated for the acquisition regions and associated with them. The corresponding automatically-parameterized sub-measurements (data acquisitions) are automatically implemented and their measurement data sets are subsequently combined into an overall measurement data set of the examination region.

The method according to the invention thus simplifies the implementation of measurements of larger examination regions, by the pre-processing and post-processing times being shortened for the user. Simultaneously the examination time is shortened because as noted, the MR apparatus acts as an expert system and can independently determine measurement parameters of the acquisition region.

A further advantage of the invention is that measurement tasks and thus MR exposures can be planned independently of the MR apparatus, since the measurement task (i.e. the measurement sequence and the examination region) is automatically adapted to various maximum acquisition regions of different MR apparatuses with the inventive method.

Additionally, artifacts are reduced in "Breath-hold and Triggering/Gating" methods for physiological examinations, since data can be acquired from large volumes or spatially separate volumes and can be divided into groups or sets by adaptation of the acquisition regions to the maximum acquisition region required by the measurement sequence.

The adjustment of the dimensions of the examination region can ensue either continuously or stepped in units of a pre-set measurement—for example of the maximum acquisition volume—in an embodiment of the method. In the inventive method, the examination region preferably is separated into equal acquisition regions such an optimal number of measurement parameters are selected only once by the user or are automatically calculated, independently of the acquisition regions.

In a further embodiment of the method, an overlapping of acquisition regions adjacent to one another in the case of slices in the examination region being oriented such that they extend at least across two of the acquisition regions produced by separation of the examination region. This overlapping enables the slices in both acquisition regions to be connected with one another and matched to one another.

DESCRIPTION OF THE PREFERRED EMBODIMENTS

Figure 1:
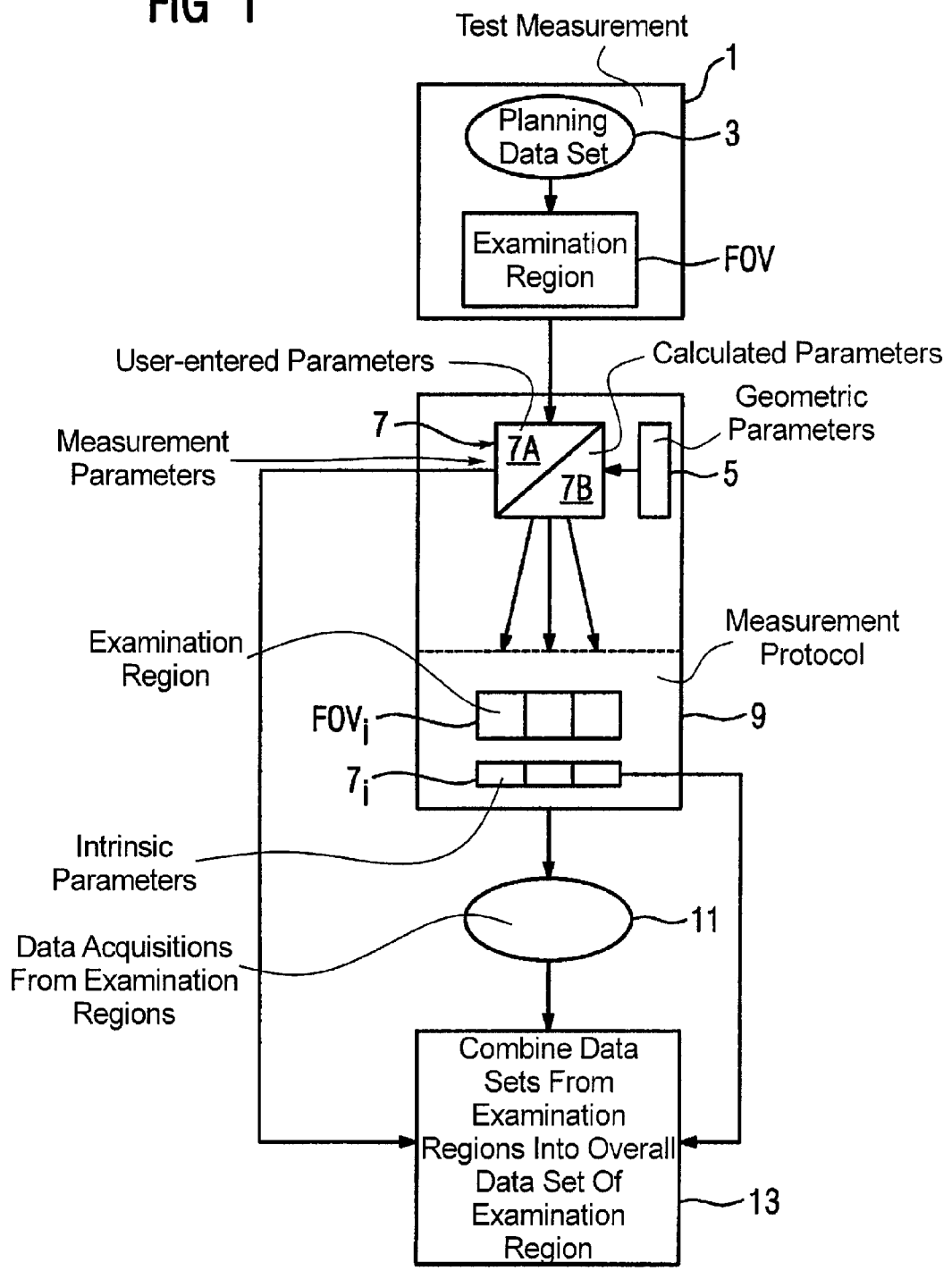
FIG. 1 is a block diagram for explaining the inventive method.

FIG. 1 explains the method for acquiring data from an examination region with a magnetic resonance apparatus, wherein the examination region is larger than a maximum acquisition region of the magnetic resonance apparatus. A planning data set 3 is acquired with a test measurement 1. The test measurement 1 is, for example, a low-resolution data set of the examination region obtained with the "Step-by-Step&Compose" technique or the "Move-during-Scan" technique. An examination region FOV is established using the planning data set 3. For this, the user marks the examination region FOV in an overview image and associates a slice alignment and an RF measurement sequence with it.

The measurement parameters 7 include parameters 7A that are directly entered by the user, for example parameters of the RF measurement sequence, TE parameters, the resolution of the ME exposure, for the examination region FOV. The parameters 7 also include parameters 7B resulting due to a division of the examination region into acquisition regions $FOV_i$ implemented by a computer of the magnetic resonance apparatus, and then may include for example, acceleration factor for parallel imaging of the acquisition regions $FOV_i$.

In the event that the examination region FOV is larger than the maximum acquisition region provided by the magnetic resonance apparatus, according to the method a measurement protocol 9 is created that optimally enables the measurement of the large examination region FOV without further input by the user. To generate the measurement protocol 9, the examination region FOV is divided into the smaller acquisition regions $FOV_i$ with incorporation of geometric parameters 6 of the magnetic resonance apparatus.

The measurement protocol 9 thus includes global measurement parameters 7 and intrinsic parameters associated with the individual acquisition regions $FOV_i$. The global parameters identically affect all measurements of the various acquisition regions $FOV_i$. As noted, they include parameters 7A that are entered and calculated parameters 7B that are, for example, acquired from the size of the examination region FOV, the geometric parameters 5 of the examination apparatus and the parameters of the RF measurement sequence. The division into parameters to be entered and calculated parameters is also present in the intrinsic parameters $7_i$.

With the global parameters 7 and the intrinsic parameters $7_i$, all parameters are present for examination. The user can possibly still correct global or intrinsic measurement parameters 7, $7_i$ before the data acquisitions 11 from the examination regions $FOV_i$ are implemented. The individual acquisition regions $FOV_i$ are thereby positioned one after the other in the maximum acquisition region of the MR apparatus such that the imaging can optimally occur uninfluenced by fold overs and interferences due to non-linearities, etc. For example, for the measurements the movement of the patient table automatically ensues corresponding to the intrinsic parameters $7_i$ of each acquisition region.

In the last step 13, the measurement data sets generated for the various acquisition regions $FOV_i$ are automatically combined into an overall measurement data set of the examination region FOV. The measurement parameters 7 and the intrinsic measurement parameters $7_i$ can be incorporated into the reconstruction. For example, an intentional overlapping of two acquisition regions $FOV_i$ can be taken into account, such that slices of the various acquisition regions merge into a single slice. The resulting overall measurement data set is shown to the user for medical appraisal.

The calculations necessary for the method can be executed, for example, by a computer of the magnetic resonance apparatus.

Examples of global parameters are a uniform measurement of the acquisition regions $FOV_i$ given by its dimensions $\Delta X_i$ and $\Delta Y_i$ as well as by the slice thickness $\Delta Z_i$ and the number of slices per acquisition region $FOV_i$, the resolution, the size of the overlapping of two acquisition regions $FOV_i$, the measurement parameters of the RF measurement sequence. Examples of intrinsic parameters are the table position at which the associated acquisition region is optimally positioned in the maximal acquisition region MFOV, the number of the coils used per acquisition regions $FOV_i$, acceleration factors resulting from this for parallel imaging in the measurement and adjustment parameters such as, for example, shim parameters for magnetic field shimming.

Figure 2:
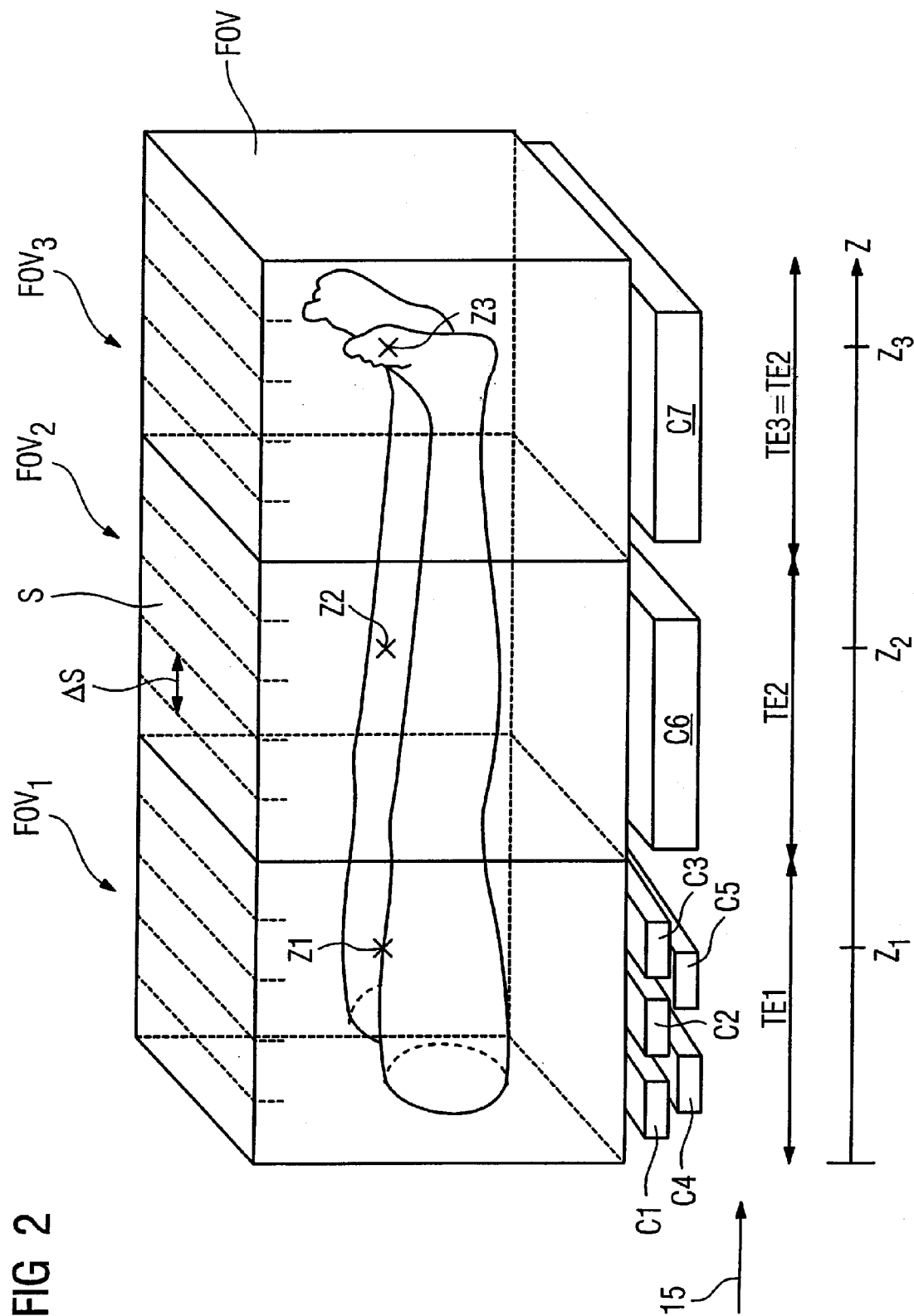
FIG. 2 schematically shows an examination region for illustrating the division thereof into acquisition regions, and the association of measurement parameters therewith, in accordance with the invention.

FIG. 2 schematically shows a test measurement of the legs of a patient. The cuboid examination region FOV is plotted by the user. The examination region FOV is exemplarily aligned in the shifting direction Z. It is automatically divided into three acquisition regions $FOV_1$, $FOV_2$ and $FOV_3$. The slices S run parallel to the boundary surface of two acquisition regions $FOV_{1...}$. These are fashioned cuboid-shaped and exhibit a sub-division into five slices of slice thickness $\Delta S$. Center Z1, Z2, Z3 are respectively associated with the acquisition region.

The test measurement additionally supplies information about the respective local coils 15 that can be used. These are schematically indicated and associated with the various acquisition regions. For example, the local coils C1, ... C5 are associated with the acquisition region $FOV_1$, the local coil C6 is associated with the acquisition region $FOV_2$ and the local coil C7 is associated with the acquisition region $FOV_3$. Different acceleration factors or various TE parameters (TE1, TE2 and TE3) result for the various acquisition regions $FOV_{i...}$ based on the local coils 15 used.

Acquisition region-specific (intrinsic) measurement parameters are, for example, the individual coils for reception of the magnetic resonance signal C1, ... C7, which coils are associated with the acquisition regions. Various acceleration factors for parallel imaging can be used dependent on the number of usable coils C1, ... C7. For example, in FIG. 2 an image acceleration is only possible in the first acquisition region $FOV_1$. The TE parameters also can be automatically adjusted by suitable processing of the test measurement. The alignment and bearing of the slices S with an acquisition region $FOV_1$ preferably relate to the associated center Z1, ... Z3, such that the information about the slice alignment is likewise specific to each acquisition region $FOV_1$, ... $FOV_3$. In general most parameters can act and be used globally or intrinsically depending on the situation.

Figure 3:
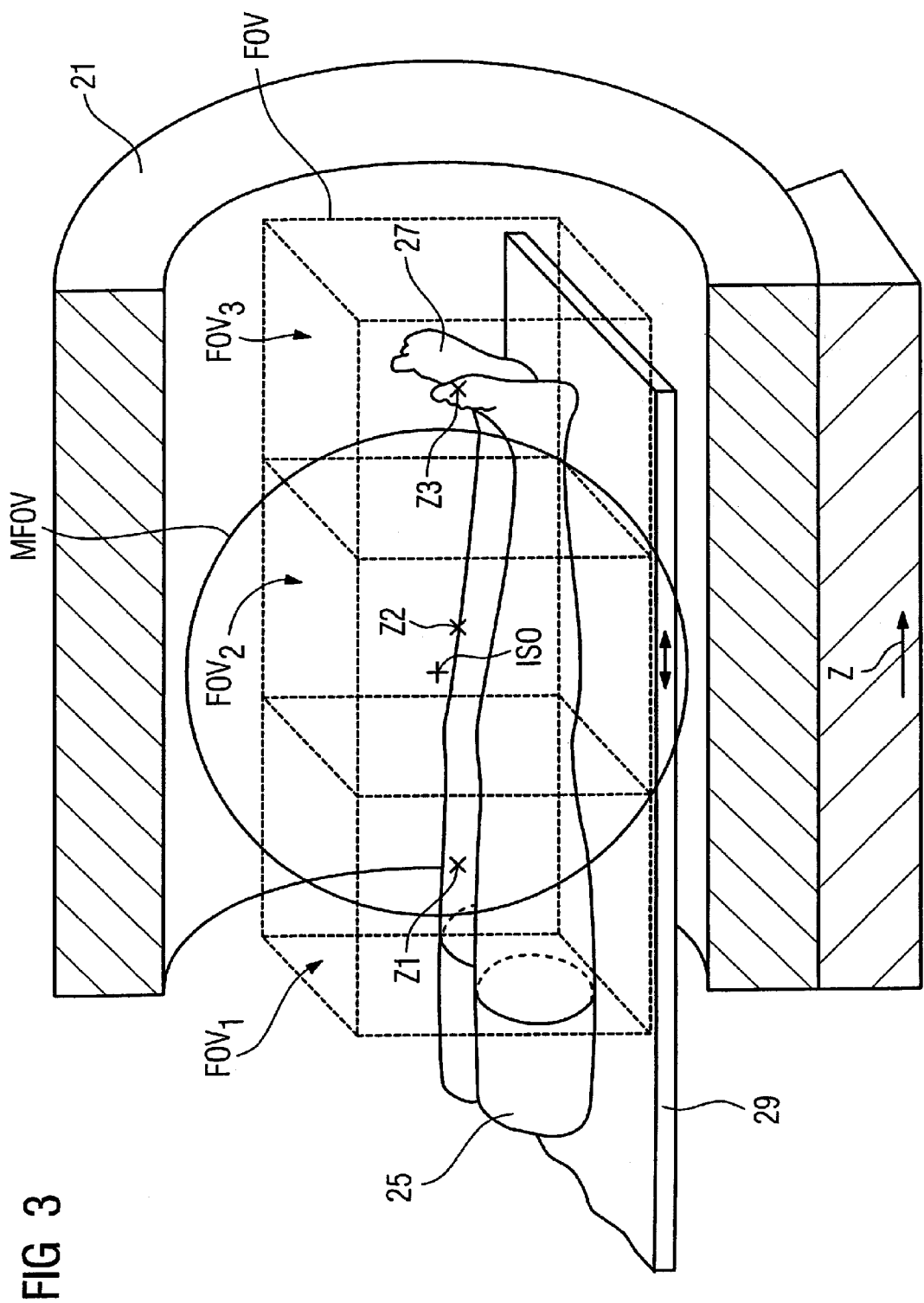
FIG. 3 shows a section through a magnetic resonance apparatus in which a middle acquisition region from FIG. 2 was moved into the isocenter of a maximum acquisition region of the magnetic resonance apparatus for data acquisition in accordance with the invention.

FIG. 3 shows a section through a magnetic resonance apparatus 21 (fashioned cylindrically) with a maximum acquisition region 23 having a spherical shape in the center of the patient opening and that can vary dependent on the required qualities of basic magnetic field, gradient magnetic field and radio-frequency field within its radius. An isocenter ISO is associated with the maximum acquisition region MFOV.

Data acquisition from the examination region FOV of FIG. 2 is explained in FIG. 3. A patient 25 whose legs 27 should be examined is located on a movable patient bed 29 of the magnetic resonance apparatus 21. The MR measurement is started after the planning of the measurement task has been implemented (for example similar to the situation shown in FIG. 2). Data acquisition from the middle acquisition region $FOV_2$, in which the center Z2 of the acquisition region $FOV_2$ is as close as possible to the isocenter ISO, is explicitly shown in FIG. 3.

The automatic division of the acquisition region FOV has ensued such that each of the acquisition regions $FOV_{1...}$ lies within the maximum acquisition region 23 during the measurement and is optimally homogeneously exposed. The gradient coils and the RF transmission antennas are activated using the geometric relation of the individual slices to the center Z2 and the geometric relation of the center Z2 to the isocenter ISO, such that the planned slices of the center acquisition region $FOV_2$ are acquired. The implementation of the measurements of the various acquisition regions $FOV_{j...}$ ensues automatically, meaning that the various acquisition regions are automatically positioned in series within the maximal acquisition region 23 by a control unit of the magnetic resonance apparatus 21.

Figure 4A:
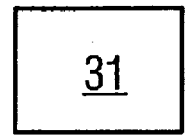
FIGS. 4A-4G show exemplary divisions of examination regions of various sizes into acquisition regions in accordance with the invention.
Figure 4B:
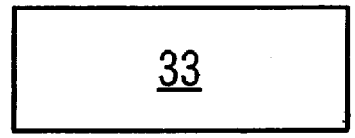

Possible procedures for division of examination regions of different sizes into acquisition regions are illustrated in using FIGS. 4A through 4G. FIG. 4A shows an acquisition region 31 with minimum dimensions and FIG. 4B shows an acquisition region 33 with maximum dimensions, the maximum dimensions being determined by the maximum acquisition region of the magnetic resonance apparatus. In the example, the largest acquisition region 33 is twice as wide as the minimum acquisition region 31. If the requirements for homogeneity and linearity of the magnetic and gradient fields increase, the acquisition region 33 shrinks.

Figure 4C:
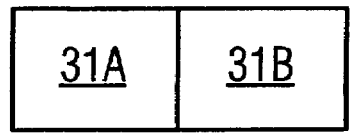
Figure 4D:
Figure 4E:
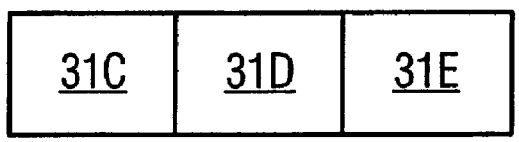

The largest acquisition region 33 can already be divided into two smallest acquisition regions 31A, 31B, corresponding to FIG. 4C. If the examination region is even wider, two acquisition regions 35A, 35B (corresponding to FIG. 4D) can be used whose width is between that of the smallest acquisition region 31 and that of the largest acquisition region 33. In, for example, fast measurement sequences, it may be advantageous to optimally work with large acquisition regions corresponding to FIG. 4D. For measurement sequences placing high demands on the field qualities, it may be advantageous to work with small acquisition regions. The situation from FIG. 4D can thus likewise be measured via three of the smallest acquisition regions 31C, ... 31E shown in FIG. 4E.

Figure 4F:
Figure 4G:
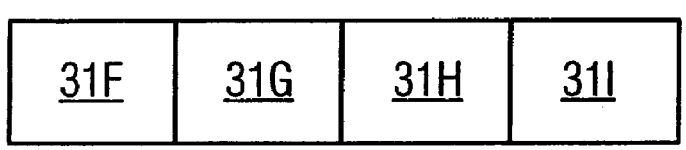

If the examination region is even wider, for example, two of the largest acquisition regions 33A, 33B according to FIG. 4F can be used or, corresponding to FIG. 4G, four of the smallest acquisition regions 31F, . . . 31I can be used. The division shown in FIGS. 4A through 4G of examination regions of different sizes into acquisition regions of different sizes can occur in various manners. For example, the width of the examination region can be adjustable, by the acquisition regions being adjusted continuously width. Alternatively, the width of the acquisition region can be set in steps so that the adjustment of the examination region ensues in blocks of the size of the respective fixed acquisition region steps.

Figure 5:
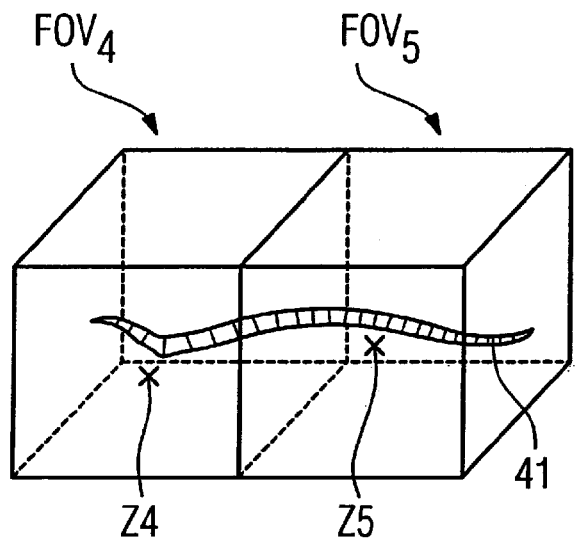
FIG. 5 shows the alignment of slices for a spinal column exposure in accordance with the invention.

FIG. 5 illustrates the intrinsic parameters of the slice alignment using the measurement of a spinal column 41 with the aid of two acquisition regions $FOV_4$ and $FOV_5$. Centers Z4 and Z5 are associated with each of the acquisition regions. The alignment of the slices perpendicular to the orientation of the spinal column 41, respectively with regard to the centers Z4 and Z5, is specified as an intrinsic parameter specific to the acquisition region.

Figure 6:
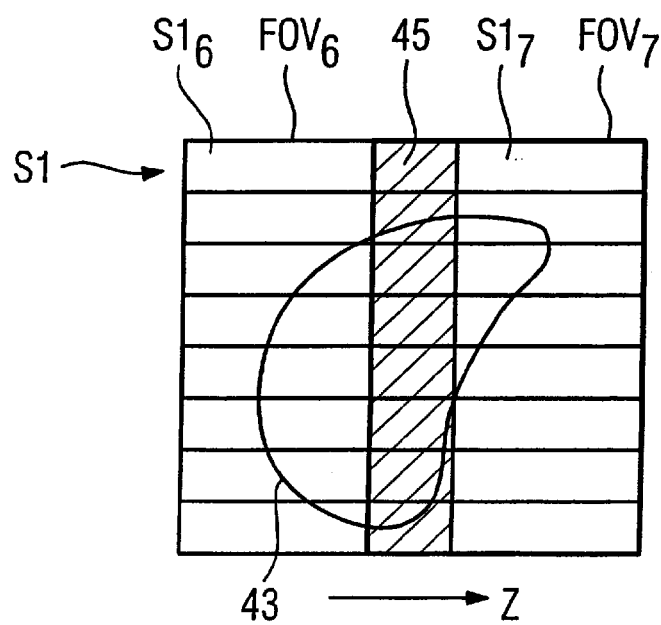
FIG. 6 shows overlapping of two acquisition regions for a liver imaging in accordance with the invention.

FIG. 6 explains the use of an overlapping 43 of two acquisition regions $FOV_6$ and $FOV_7$ in the example of the measurement of an enlarged liver 45. The slices of the measurement proceed across both acquisition regions $FOV_6$, $FOV_7$ such that, for example, the slice S1 is composed of the slices $S1_6$ of the acquisition region $FOV_6$ and the slice $S1_7$ of the acquisition region $FOV_7$. In order to optimally, unobtrusively combine the slices $S1_6$ and $S1_7$ into slice S1, the overlapping region 43 is used in order to calculate possible fluctuations in the intensity or positioning.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance data from an examination region using a magnetic resonance apparatus, the examination region being larger than an inherently maximum data acquisition region from which the magnetic resonance apparatus is structurally and operationally capable of acquiring magnetic resonance data, comprising the steps of:

generating a planning data set and establishing said examination region using said planning data set;

in a computer of said magnetic resonance apparatus, automatically separating the examination region into a plurality of acquisition regions having respective dimensions with said inherently maximum acquisition region of said magnetic resonance apparatus being an upper limit for said dimensions;

creating a measurement protocol comprising a first group of measurement protocol parameters that are applicable for all of said acquisition regions, and at least one second group of measurement protocols that are applicable specifically for one of said acquisition regions;

automatically positioning said acquisition regions in series within said inherently maximum acquisition region using said measurement protocol, and acquiring a magnetic resonance data set from each of said acquisition regions;

combining said magnetic resonance data sets into an overall magnetic resonance data set of said examination region using said computer and said first and second groups of measurement parameters of said measurement protocol said overall data set comprising data representing said examination region that is larger than said inherently maximum data acquisition region; and making said overall data set available for processing into an image of said examination region.

2. A method as claimed in claim 1 wherein the step of establishing said examination region comprises setting dimensions of said examination region in successive units, each of a predetermined dimension.

3. A method as claimed in claim 1 wherein the step of automatically separating said examination region into a plurality of acquisition regions comprises automatically dividing said acquisition region into a plurality of equally sized acquisition regions.

4. A method as claimed in claim 1 wherein the step of establishing said examination region comprises setting dimensions of said examination region continuously.

5. A method as claimed in claim 1 wherein the step of automatically separating said examination region into a plurality of acquisition regions comprises initially dividing said examination region into a plurality of equally sized acquisition regions, and automatically individually adjusting respective dimensions of the acquisition regions between a minimum volume and a maximum volume.

6. A method as claimed in claim 1 wherein the step of automatically separating said examination region into a plurality of acquisition regions includes partially overlapping at least two of said acquisition regions with each other to encompass a slice orientation of a slice of said examination region extending across said at least two of said acquisition regions.

7. A method as claimed in claim 1 comprising, in said computer, automatically aligning respective slice orientations of slices in said examination region dependent on a geometry of said examination region.

8. A method as claimed in claim 1 wherein the step of automatically positioning said acquisition regions comprises automatically positioning one of said acquisition regions in a maximum acquisition volume, using said measurement parameters, to obtain a substantially distortion-free magnetic resonance data set from that acquisition region.

* * * * *